US006929725B2

(12) United States Patent
Friedrich et al.

(10) Patent No.: US 6,929,725 B2
(45) Date of Patent: Aug. 16, 2005

(54) SPUTTER IONS SOURCE

(75) Inventors: Manfred Friedrich, Dresden (DE); Horst Tyrroff, Stolpen (DE)

(73) Assignee: Forschungszentrum Rossendorf e.V., Dresden (DE)

( * ) Notice: Subject to any disclaimer, the term of this patent is extended or adjusted under 35 U.S.C. 154(b) by 173 days.

(21) Appl. No.: 10/655,896

(22) Filed: Sep. 4, 2003

(65) Prior Publication Data

US 2004/0182699 A1 Sep. 23, 2004

(30) Foreign Application Priority Data

Sep. 6, 2002 (DE) ........................................ 102 41 252

(51) Int. Cl.[7] ................................................ C23C 14/34

(52) U.S. Cl. .............................. 204/298.11; 204/298.06

(58) Field of Search ....................... 204/298.06, 298.11, 204/298.12

(56) References Cited

U.S. PATENT DOCUMENTS 4,123,686 A * 10/1978 Keller et al. ................ 313/230

OTHER PUBLICATIONS

Dec. 2, 1990 "The AMS System at the Shanghai Institute of Nuclear Research" Liu Lianfan et al. Nuclear Instruments & Methods in Physics Research, Section –B: Beam Interactions with Materials and Atoms, North–Holland Publishing Company. Amsterdam, NL, Bd. B52, Nr. 3/4 pp. 298–300.

Sep. 1, 1983 "A Versatile High Intensity Negative Ion Source" R. Middleton Nuclear Instruments and Methods, Bd. 214, pp. 139–150.

Jan. 2, 1992 "The Hvee Tandetron Line; New Developments and Design Considerations" Mous D J W et al. Nuclear Instruments & Methods in Physics Research, Section –B; Beam Interactions with Materials and Atoms, North–Holland Publishing Company. Amsterdam, NL, Bd. B62, Nr. 3 pp. 421–424.

Feb. 1, 1993 "Ion Sources for Accelerators in Materials Research" Alton G D Nuclear Instruments & Methods in Physics Research, Section –B: Beam Interactions with Materials and Atoms, North–Holland Publishing Company. Amsterdam, NL. Bd. B73, Nr. 2. pp. 221–288.

1993; Ion Sources For Accelerators in Materials Research; G.D. Alton; Nuclear Instruments and Methods in Physics Research; pp. 221–288.

Apr. 2, 1993; Sputter Ion Source; High Voltage Engineering Europa B.V.; pp. 1–18.

* cited by examiner

*Primary Examiner*—Steven Versteeg
(74) *Attorney, Agent, or Firm*—Jordan and Hamburg LLP

(57) ABSTRACT

A sputter ion source includes an ionizer; a sputter cathode, including a cathode, a sputter insert, and a shielding cap; a forming electrode; cathode insulator; a hollow, cylindrical shielding cathode, surrounding the sputter cathode, and tapered rotationally symmetrically in the region of the sputter insert; and a vacuum-tight housing for enclosing all of the foregoing. The sputter ion source has a prolonged operating life, low maintenance costs, and prevents atomization of parts of the ion source, for generating negative ions, in the vicinity of the cathode insert.

4 Claims, 1 Drawing Sheet

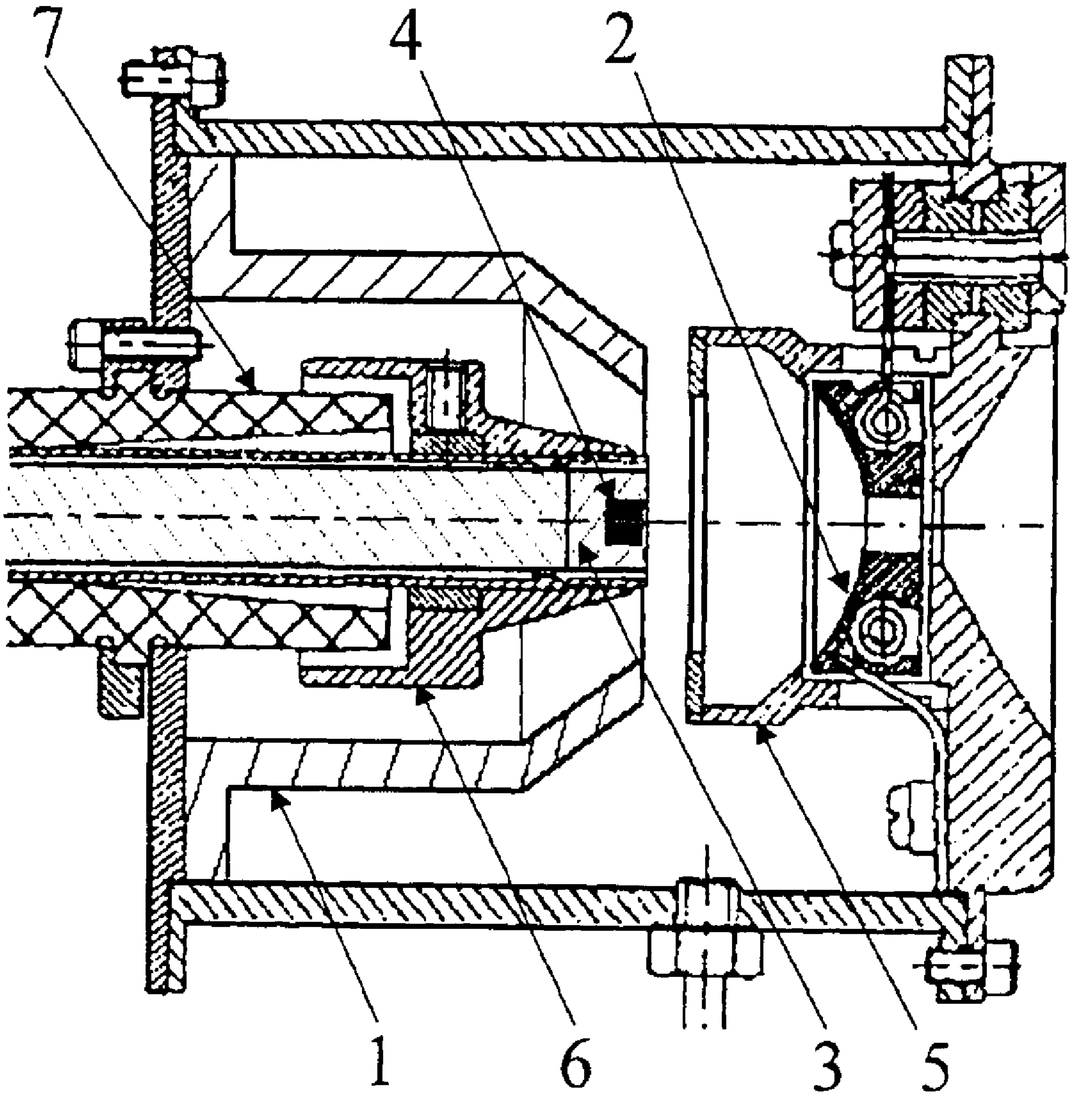
7
4
2
1
6
3
5

SPUTTER IONS SOURCE

The invention relates to a sputter ions source. The invention can be used particularly for Cs sputter ions sources at particle accelerators.

It is known that negative ions may be produced by means of Cs sputter ion sources (G. D. Alton, Nuclear Instruments and Methods B73 (1993), page 254) for accelerating in particle accelerators. For this purpose, Cs atoms are converted into positive Cs ions at a hot surface ionizer in Cs sputter ions sources. These Cs ions are accelerated in the direction of the cathode by a potential difference between the ionizer and the negative cathode and focused onto a sputter insert, which consist of the material, from which the negative ions are to be produced. The negative ions, formed by the atomization of the sputter insert, are accelerated by the same potential difference in the direction of the ionizer and extracted through an opening in the center of the ionizer.

The IONEX 860-C or HVEE 860-C of High Voltage Engineering Europa B. V. Amersfoort/NL (HVEE Handbuch A-4-35 für Sputterionenquelle (Handbook for Sputter Ions Source) 860-C), which has been produced unchanged for decades, is the sputter ion source, which is used most frequently with commercial accelerators. The wear of the shielding cap of the cathode of this sputter ions source and the covering of the cathode insulator with a conductive material, which is associated therewith, is a disadvantage of this construction, because it makes a periodic exchange of these parts and, with that, a dismantling of the ion source necessary. This disadvantage cannot be explained on the basis of the ion optical construction of the ion source and the tracks of the Cs ions, formed at the surface of the ionizer.

It is an object of the invention to prolong the service life of a sputter ions source, to lower the maintenance costs and largely to prevent atomization of parts of the ions source, which are in the vicinity of the cathode insert, which is necessary for generating the negative ions.

Pursuant to the invention, this objective is accomplished with the distinguishing features, which are set forth in claim 1. Further developments of the invention are described in the dependent claims.

It was possible to attribute the cause of the atomization of the source parts to positive Cs ions, which are formed outside of the spherical ionization surface, for example at an adjacent hot electrode for forming the positive Cs ion beam. The inventive shielding electrode prevents these undesirable ions striking the cathode. In this connection, the shielding electrode surrounds the sensitive parts of the cathode holder and the cathode insulator. Since the potential of this shielding electrode is selected to be the same or approximately the same as the potential of the ionizer, the Cs ions, against which shielding is to be provided, strike this shielding electrode only with little energy if at all, and do not bring about any atomization of material. By fastening the shielding electrode to the coldest part of the inner source vessel, thermal ionization of Cs atoms at the surface of this electrode is prevented.

The advantage of the invention consists therein that atomization of the cathode parts and the therefrom resulting coverage of the cathode insulator with conductive material are largely prevented. As a result, the service life of the ion source is prolonged, the maintenance costs and costs of spare parts are lowered and the availability of the equipment, for which the ion source is used, is improved.

The invention will be explained in greater detail below by means of an example.

The drawing shows the inner part of a known Cs sputter ions source of the 860-C type, comprising the parts of ionizer 2, cathode 3, sputter insert 4, forming electrode 5, shielding cap 6 and cathode insulator 7. Pursuant to the invention, an additional, hollow cylindrical shielding 1 electrode is introduced, which surrounds the sputter cathode with components comprising the cathode 3, the sputter insert 4 and the shielding cap 6. In the region of the sputter insert 4, the shielding electrode 1 is tapered rotationally symmetrically.

The shielding electrode 1 can be bolted to the housing. In this connection, the shielding electrode 1 should be mounted as far as possible away from the ionizer 2. The positive Cs ions are produced at the spherical surface of the hot ionizer 2 and accelerated by a potential difference between the ionizer 2 and the cathode 3 and focused onto the sputter insert 4 of the cathode 3. Positive Cs ions are also formed at the hot surface of the forming electrode 5 and accelerated onto the shielding cap 6 of the cathode 3. The atomized material of the shielding cap 6 is deposited, for instance, also on the surface of the cathode insulator 7 and leads to a short circuit within the ions source. Depending on the operating regime of the source, the shielding cap 6 and the cathode insulator 7 must be exchanged after 500 operating hours. The service life of the source is prolonged by a multiple due to the additional shielding electrode 1.

What is claimed is:

1. Sputter ion source, comprising:

a vacuum-tight housing, containing:
- an ionizer;
- a sputter cathode, comprising:
  - a cathode;
  - a sputter insert; and
  - a shielding cap;
- a forming electrode;
- a cathode insulator; and
- a shielding cathode, having a hollow, cylindrical shape, surrounding said sputter cathode, and tapering rotationally symmetrically in a region adjacent to said sputter insert.

2. Sputter ion source of claim 1, wherein said shielding electrode is on said housing and has an electric potential substantially the same as an electric potential of said ionizer.

3. Sputter ion source of claim 1, wherein there is a connection between a cathode-facing side of said forming electrode and said shielding electrode, which is an only connection of said forming electrode.

4. Sputter ion source of claim 1, wherein said shielding electrode is connected to a coldest part of said housing.

* * * * *